(12) United States Patent
Woo

(10) Patent No.: US 6,967,538 B2
(45) Date of Patent: Nov. 22, 2005

(54) PLL HAVING VCO FOR DIVIDING FREQUENCY

(75) Inventor: Sung Hun Woo, Cheongju-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 27 days.

(21) Appl. No.: 10/603,647

(22) Filed: Jun. 25, 2003

(65) Prior Publication Data

US 2004/0104780 A1 Jun. 3, 2004

(30) Foreign Application Priority Data

Nov. 28, 2002 (KR) .................................. 10-2002-0074649

(51) Int. Cl.[7] .............................................. H03B 21/00
(52) U.S. Cl. ...................................... 331/73; 331/36 C
(58) Field of Search ................ 331/74, 36 C, 331/68; 327/156, 147

(56) References Cited

U.S. PATENT DOCUMENTS

| | | | |
|---|---|---|---|
| 4,394,776 A | | 7/1983 | Borras et al. |
| 4,472,820 A | | 9/1984 | Borras |
| 4,847,571 A | * | 7/1989 | Stevance et al. ............... 331/96 |
| 4,916,716 A | * | 4/1990 | Fenner et al. ................ 257/480 |
| 4,990,866 A | * | 2/1991 | Martheli ...................... 331/99 |
| 5,701,598 A | | 12/1997 | Atkinson |
| 6,137,372 A | | 10/2000 | Welland |
| 6,233,441 B1 | | 5/2001 | Welland |
| 6,304,146 B1 | | 10/2001 | Welland |
| 6,327,463 B1 | | 12/2001 | Welland |
| 6,329,855 B1 | | 12/2001 | Horie |
| 6,424,192 B1 | | 7/2002 | Lee et al. |

FOREIGN PATENT DOCUMENTS

| | | |
|---|---|---|
| JP | 3135112 | 6/1991 |
| JP | 3139018 | 6/1991 |
| JP | 6104750 | 4/1994 |
| KR | 2002-0028418 | 4/2002 |
| KR | 2002-00066473 | 8/2002 |

OTHER PUBLICATIONS

Paul V. Brennan, "Phase–Locked Loops Principles and Practice", McGraw–Hill, 1996, pp. 1–5.*

* cited by examiner

Primary Examiner—Robert Pascal
Assistant Examiner—Joseph Chang
(74) Attorney, Agent, or Firm—Marshall, Gerstein & Borun LLP

(57) ABSTRACT

A PLL comprising a phase detector, a loop filter and a VCO is disclosed. The phase detector periodically compares an externally inputted clock signal with a frequency of an internal clock signal, and outputs an output signal resulting from phase difference of the two signals. The loop filter outputs a predetermined voltage in response to an output signal from said phase detector. The VCO outputs said internal clock signal having a frequency proportional to said predetermined voltage. Here, the VCO includes a capsule for adjusting the value of capacitance using an internal control signal. As a result, frequencies may be pre-compensated by control signals used in the PLL. In addition, the disclosed PLL having a VCO therein can be configured into a single chip, thereby simplifying the embodiment of the whole PLL and enabling accurate compensation.

5 Claims, 7 Drawing Sheets

PLL HAVING VCO FOR DIVIDING FREQUENCY

BACKGROUND

1. Technical Field

A phase locked loop (abbreviated as "PLL") is disclosed. More specifically, a PLL having a voltage control oscillator (abbreviated as "VCO") configured to divide the frequency outputted from the VCO in wide frequency bands is disclosed.

2. Description of the Related Art

FIG. 1 is a block diagram illustrating a conventional PLL using a pulse swallow system.

The conventional PLL comprises a phase comparator 1, a low pass filter 2, a VCO 3, a dual modulus prescaler 4, a program counter 5, a swallow counter 6 and a controller 7. The phase comparator 1 compares a reference frequency fr of an external clock signal with a comparison frequency fp of a comparison clock signal PCLK. The VCO 3 generates a clock signal ICLK. The frequency of the clock signal ICLK is proportional to the direct current (DC) signal from the low pass filter 2. The dual modulus prescaler 4 divides a frequency of the clock signal ICLK in the ratios of 1/M and 1/(M+1). The program counter 5 divides a clock signal divided by the prescaler 4 in the ratio of 1/N. The swallow counter 6 divides the clock signal divided by the prescaler 4 in the ratio of 1/A. The controller 7 outputs a mode control signal MC for controlling the prescaler 4 using signals from the program counter 5 and the swallow counter 6.

A frequency fvco of the clock signal ICLK from the VCO 3 is divided by the dual modulus prescaler 4 in the ratios of 1/M and 1/(M+1), and then inputted into the program counter 5 and the swallow counter 6.

The swallow counter 6 is used to control the division ratio of the prescaler 4. The prescaler 4 divides in the ratio of 1/(M+1) until the swallow counter 6 counts A pulses.

After the swallow counter 6 counts A pulses, the prescaler 4 divides in the ratio of 1/M. The comparison frequency fp of the comparison clock signal PCLK is defined by Equation 1.

$$fp = \frac{fvco}{\left\{\left((M+1) \times N\right) \times \frac{A}{N}\right) + \left((M \times N) \times \frac{(N-A)}{N}\right)\right\}} \qquad \text{Equation 1}$$

$$= \frac{fvco}{\{((M+1) \times A) + ((N-A) \times M)\}}$$

The output frequency fvco of the output clock signal ICLK is defined by Equation 2 (here, fp=fr).

$$fvco = fp\{((M+1) \times A) + ((N-A) \times M)\} \qquad \text{Equation 2}$$

$$= fp(A + M \times N)$$

$$= fr(A + M \times N)$$

In Equation 2, When the value of A varies, the frequency fvco of clock signal ICLK is changed. In this way, if the prescaler 4 is used in the PLL, the channel separation can be the reference frequency fr. Particularly, in a frequency synthesizer of high frequency, a pulse swallow system is used because the prescaler 4 is set in a high division ratio.

Generally, the output frequency fvco of the pulse swallow system is defined by the following equation 3:

$$fvco = \{(M \times N) + A\} \times \frac{fosc}{R} \qquad \text{Equation 3}$$

Here, M is the division ratio of the prescaler 24, and N is the value of the program counter 25. A is the value of the swallow counter 26, which is smaller than N. In Equation 3, fosc represents the reference oscillating frequency, and R represents the value of the reference counter.

The VCO of the conventional PLL having a pulse swallow system cannot use various frequency bands due to its non-linear characteristic.

SUMMARY OF THE DISCLOSURE

Accordingly, a PLL having a VCO for dividing frequency that operates linearly in various frequency bands is disclosed.

There is provided a PLL comprising a phase detector, a loop filter and a VCO. The phase detector periodically compares a frequency of an externally inputted clock signal with that of an internal clock signal, and outputs an output signal resulting from phase difference of the two signals. The loop filter outputs a predetermined voltage in response to a signal from said phase detector. The VCO outputs said internal clock signal having a frequency proportional to said predetermined voltage. Here, the VCO includes a device for adjusting the value of capacitance using an internal control signal.

DETAILED DESCRIPTION OF THE PRESENTLY PREFERRED EMBODIMENTS

The disclosed PLL will be described in more detail with reference to the accompanied drawings.

Figure 1:
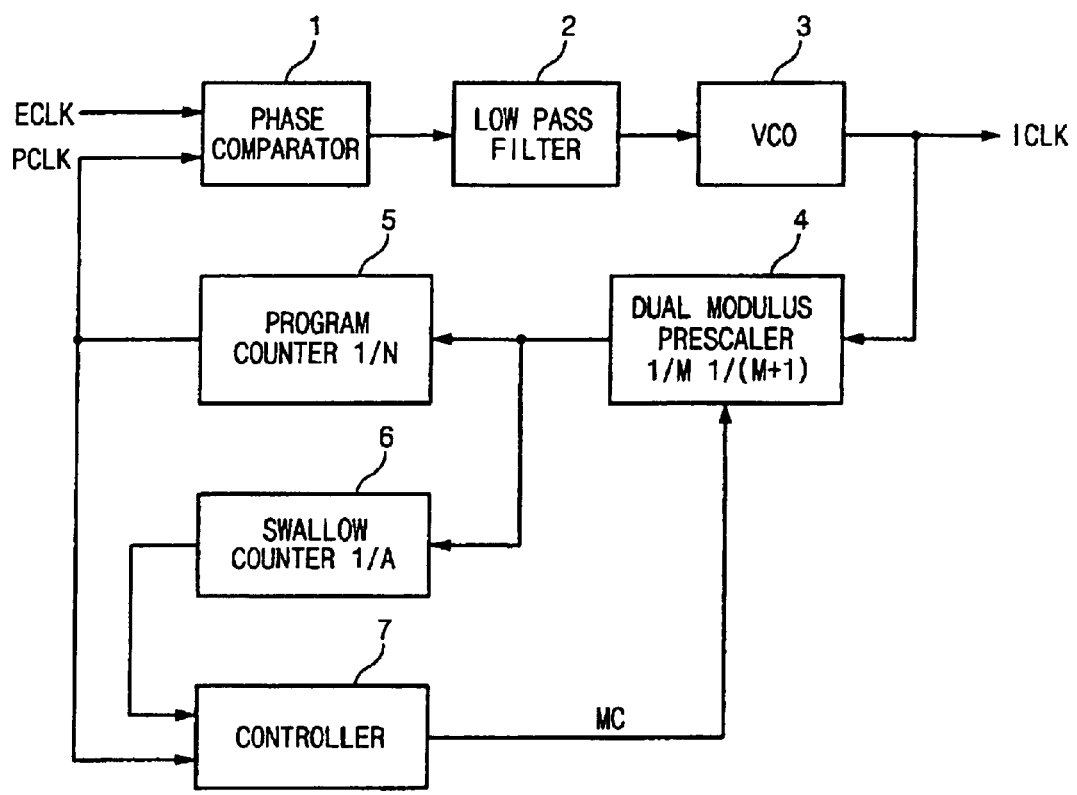
FIG. 1 is a block diagram illustrating a conventional PLL.
Figure 2:
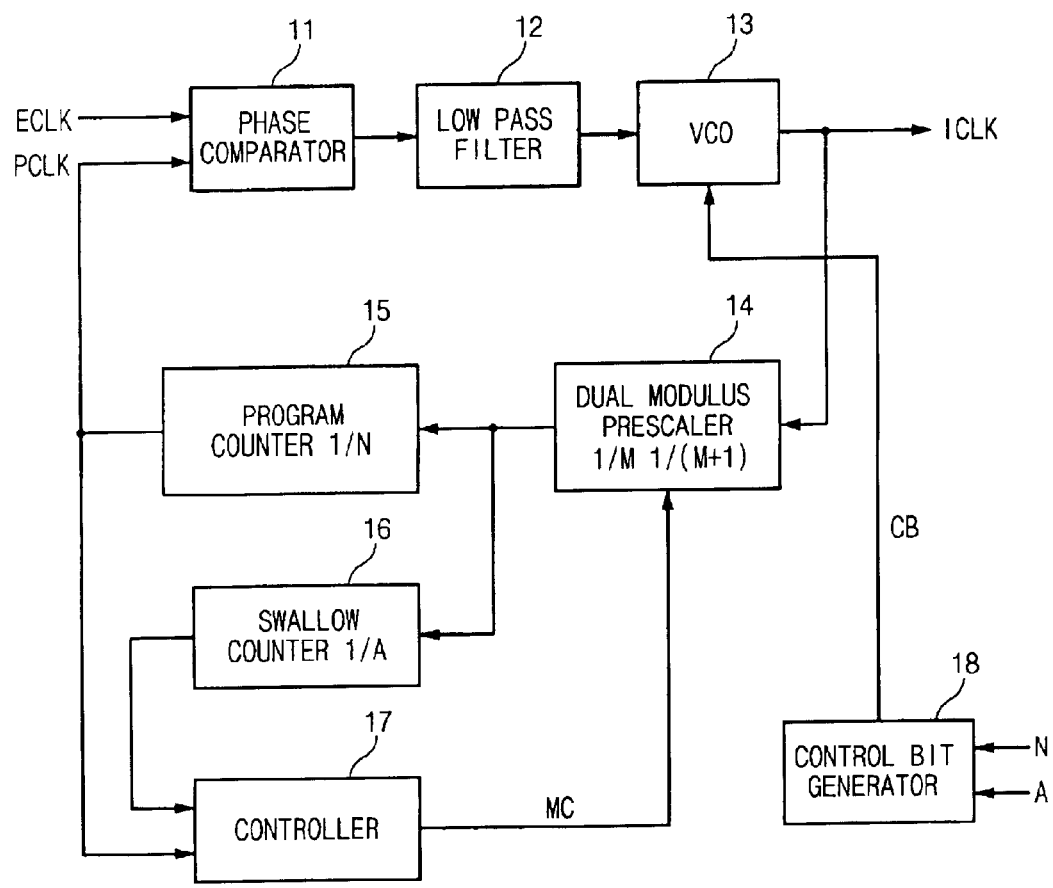
FIG. 2 is a block diagram illustrating a disclosed PLL.

FIG. 2 is a block diagram illustrating the disclosed PLL.

The PLL comprises a phase comparator 11, a low pass filter 12, a VCO 13, a dual modulus prescaler 14, a program counter 15, a swallow counter 16, a controller 17 and a control bit generator 18. The phase comparator 11 compares a reference frequency fr of an external clock signal ECLK with a comparison frequency fp of a comparison clock signal PCLK. The VCO 13 generates an internal clock signal ICLK of frequency proportional to a DC signal of the low pass filter 12. The dual modulus prescaler 14 divides an internal clock signal ICLK in the ratios of 1/M and 1/(M+1). The program counter 15 divides a clock signal from the prescaler 14 in the ratio of 1/N. The swallow counter 16 divides a clock signal from the prescaler 14 in the ratio of 1/A. The controller 17 controls the prescaler 14 by using output signals from the program counter 15 and the swallow counter 16. The control signal generator 18 generates a control signal CB<0:4> for controlling the VCO 13.

An output frequency fvco of the internal clock signal ICLK is divided by the dual modulus prescaler 34 in the ratios of 1/M and 1/(M+1). The divided frequency is inputted into the program counter 15 and the swallow counter 16.

The swallow counter 16 is used to control the division ratio of the prescaler 14. The prescaler 14 divides in the ratio of 1/(M+1) until the swallow counter 16 counts A pulses.

After the swallow counter 16 counts A pulses, the prescaler 15 divides in the ratio of 1/M.

The disclosed PLL uses the values of N and A in order to control the VCO 13. That is, the control signal generator 18 generates a control signal for controlling the VCO 13 by using the values of N and A.

Accordingly, a method should be considered to satisfy the whole range of frequency in a given variable voltage range and to reduce the actual oscillating frequency Kvco by using an oscillating frequency division method.

Figure 3:
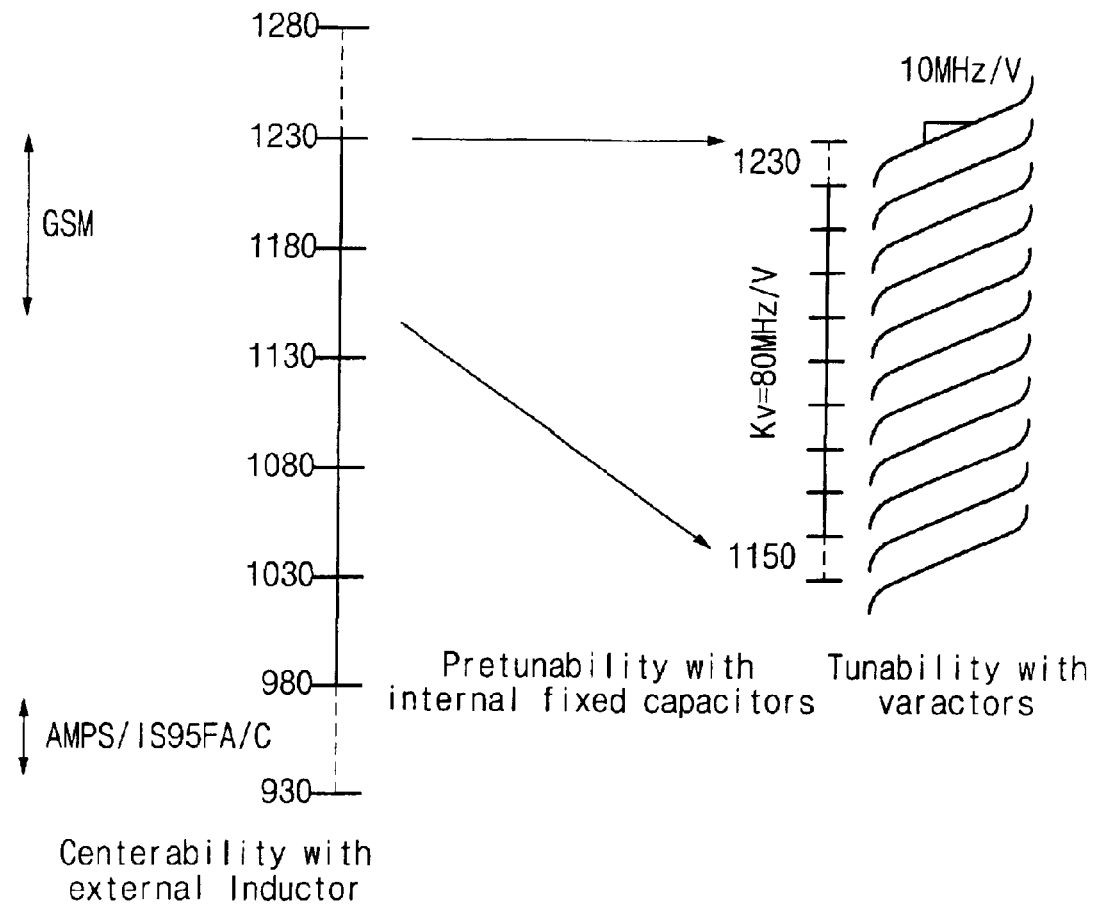
FIG. 3 is a graph illustrating an example of region split and frequency range of a VCO in the PLL of FIG. 2.

FIG. 3 is a graph illustrating an example for dividing the frequency range GSM of the VCO 13 in the PLL of FIG. 2.

Referring to FIG. 3, if the range of variable voltage is 1V in the frequency range of GSM from 1150 MHz to 1230 MHz, the oscillating frequency Kvco generally has the value of 80 MHz/V.

However, the whole frequency range can be satisfied by fixing the frequency range at 10 MHz and selecting a partial area of each frequency using an external auxiliary circuit. Each oscillating frequency Kvco can have a small value of 10 MHz/V.

In the disclosed PLL, the frequency division VCO 13 is used to have good characteristics in the wide range of frequency. When the output frequency fvco from the VCO 13 reaches its corresponding frequency area nearby, the disclosed PLL selects a corresponding section.

If a voltage gain of the VCO 33 is determined, for example, as 10 MHz/V, the number of the VCO 33 can be determined. As a result, the control signal generator 18 generates the control signal CB.

Figure 4:
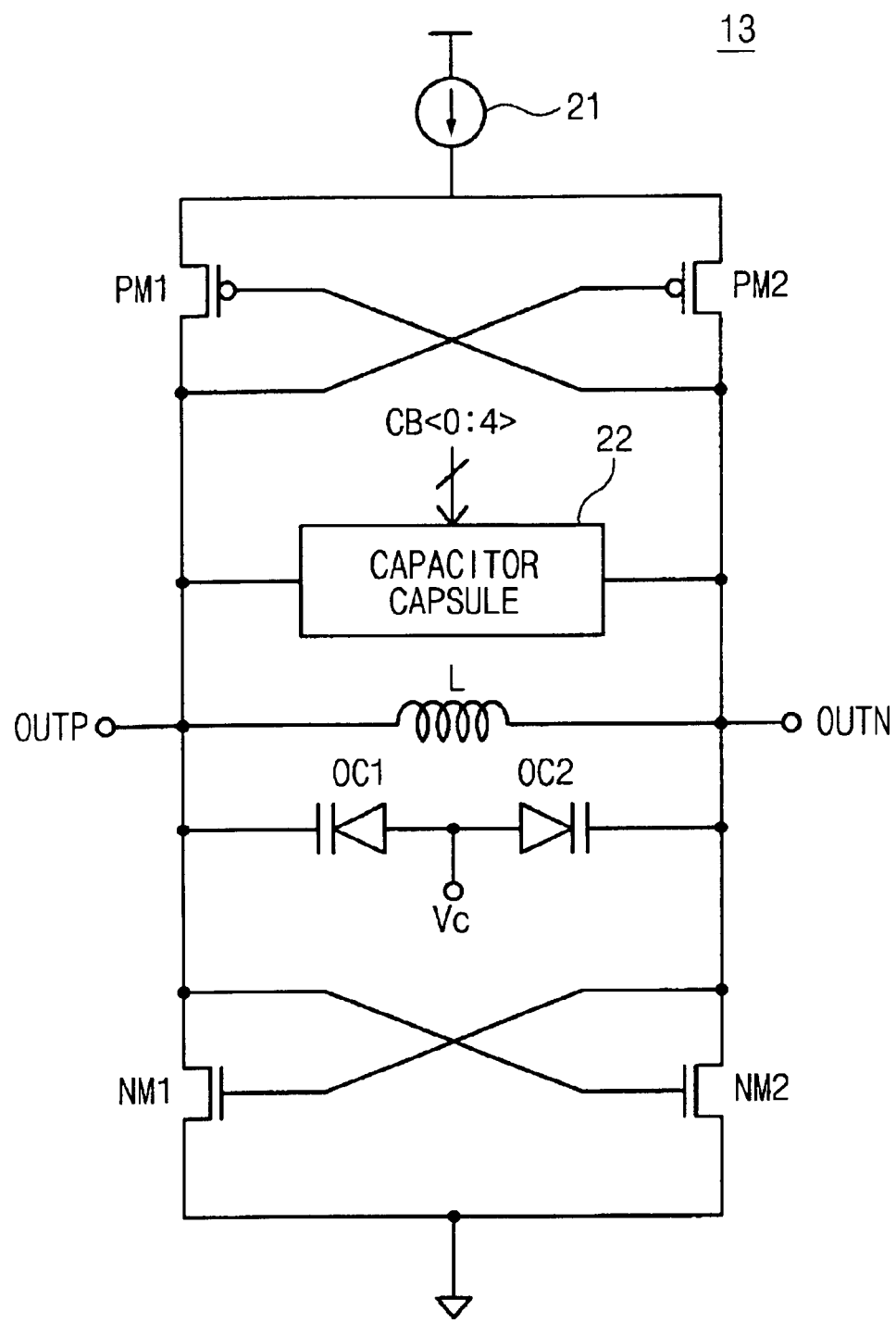
FIG. 4 is a circuit diagram illustrating a VCO in the PLL of FIG. 2.

FIG. 4 is a circuit diagram illustrating the VCO of the PLL of FIG. 2.

The VCO 13 comprises a constant current source 21, PMOS transistors PM1 and PM2, a capacitor capsule 22, an inductor L, one-way capacitors OC1 and OC2, and NMOS transistors NM1 and NM2. The PMOS transistors PM1 and PM2 are cross-coupled. The capacitor capsule 22 is connected between output terminals OUTP and OUTN. The inductor L is connected between the output terminals OUTP and OUTN. The one-way capacitor OC1 is connected between the output terminal OUTP and an input terminal Vc, and the one-way capacitor OC2 is connected between the input terminal Vc and the output terminal OUTN. The NMOS transistors NM1 and NM2 are cross-coupled. Here, the capacitor capsule 22 includes a capacitor array for selecting a section.

Figure 5:
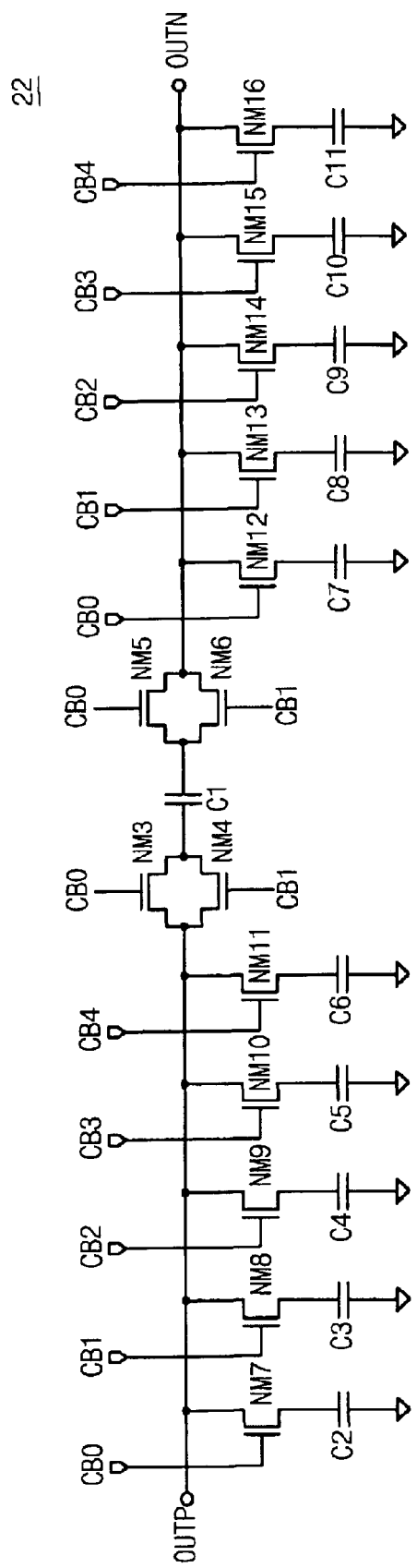
FIG. 5 is a detailed circuit diagram illustrating a capacitor capsule in the VCO of FIG. 4.

FIG. 5 is a detailed circuit diagram illustrating the capacitor capsule 22 in the VCO 13 of FIG. 4.

The capacitor capsule 22 comprises a capacitor C1 having one terminal connected to a pair of switches NM3 and NM4 and the other terminal connected to a pair of switches NM5 and NM6. The switches NM3 and NM4 are connected between the one terminal of the capacitor C1 and the output terminal OUTP. The switches NM5 and NM6 are connected between the other terminal of the capacitor C1 and the output terminal OUTN. Here, capacitors C2~C6 are connected in parallel between the switch NM3 and the output terminal OUTP by the switches NM7~NM11, and capacitors C7~C11 are connected in parallel between switch NM5 and the output terminal OUTN by the switches NM7~NM16.

Although the switches NM3~NM16 formed of NMOS transistors are exemplified herein, various types of switches can be used according to systems.

Each switch NM3~NM16 is controlled by the control signal CB<0:4> outputted from the control signal generator 18.

As a result, the oscillating frequency can be varied by changing capacitance of the capacitor capsule 22 by adjusting the control signal CB<0:4>.

Figure 6:
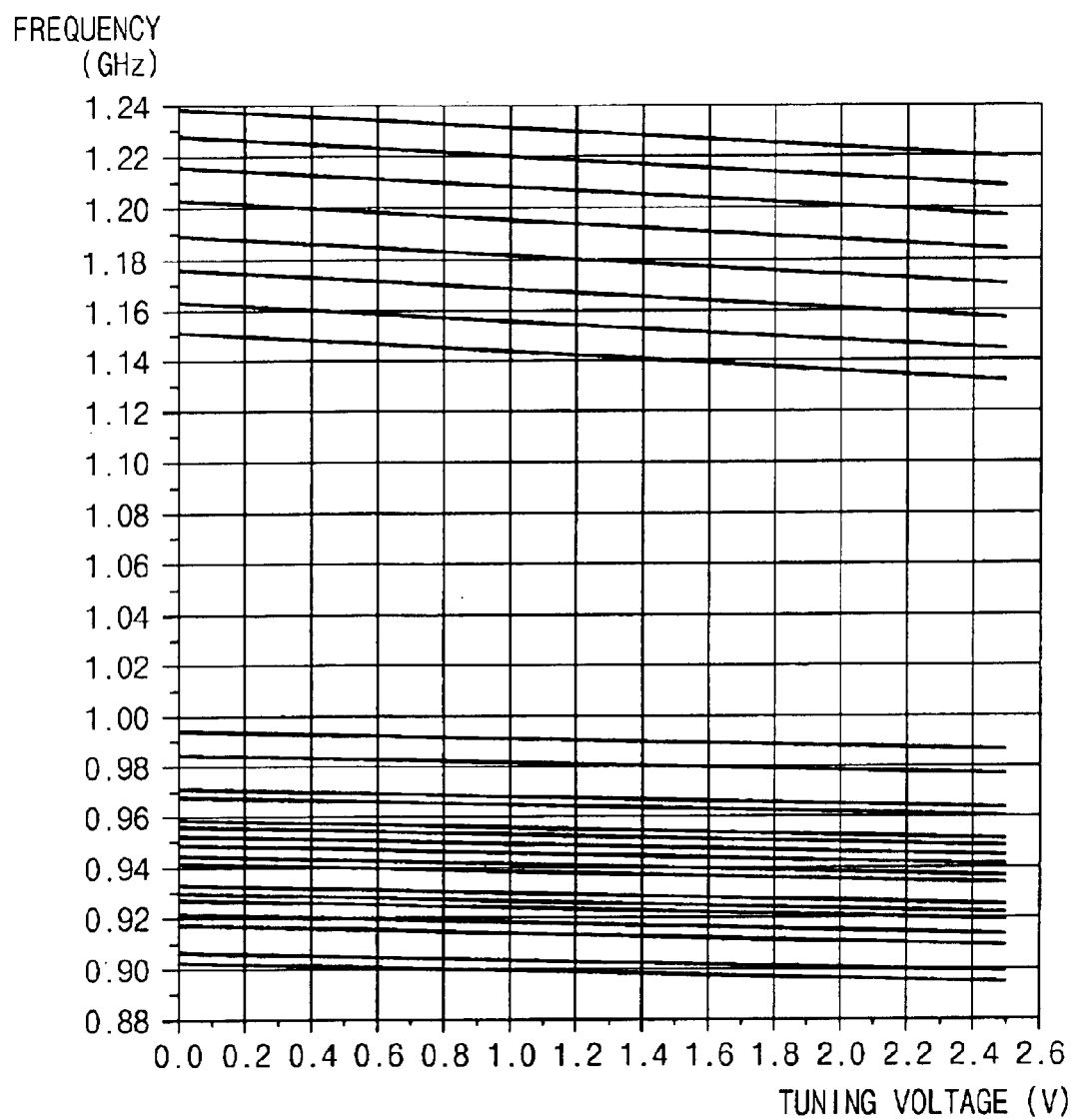
FIG. 6 is a graph illustrating tuning characteristics of the VCO of FIG. 4.

FIG. 6 is a graph illustrating tuning characteristics of the VCO 13 of FIG. 4.

Referring to FIG. 6, each oscillating frequency waveform linearly decreased depending on tuning voltage, and overlapped with the neighboring waveform.

Figure 7:
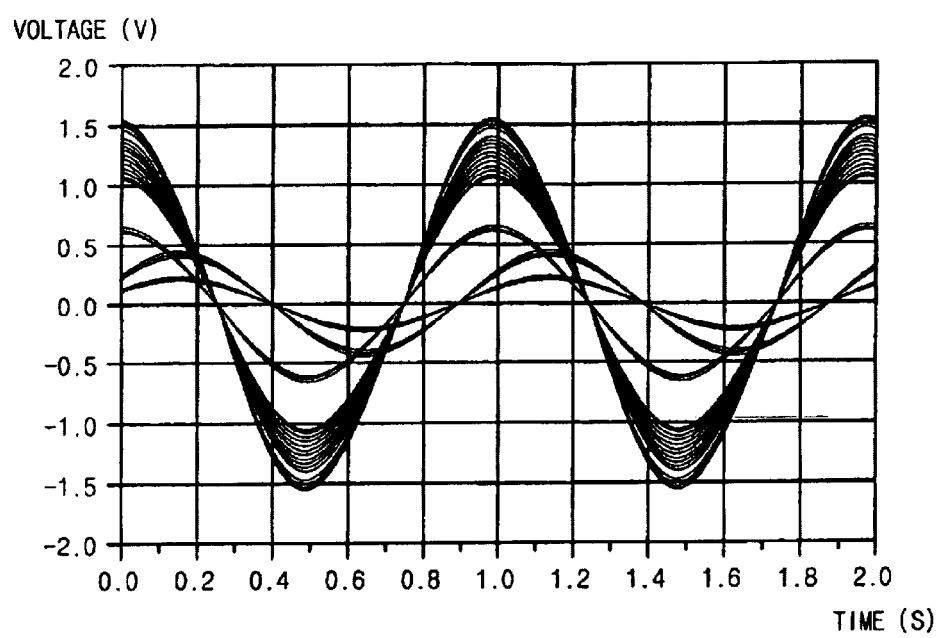
FIG. 7 is a graph illustrating output waveform of the VCO of FIG. 4.

In general, the frequency hops according to systems using the VCO. As shown in FIG. 7, the capacitance to the frequency hopping is compensated by the capacitor C1, which is inserted in parallel, by using the switches NM3~NM6 and controlled by the control signal CB<0:1>. Since the RF1 capsule has different ratio to each capacitor C1, a weighted circuit having proper weighting is required through simulation.

FIG. 7 is a graph illustrating output waveform of the VCO of FIG. 4.

Referring to FIG. 7, different frequencies are shown depending on each control signal CB<0:4>. Peak voltages of the output signals change depending on frequencies.

As a result, an additional frequency compensating signal is not required because the frequencies may be automatically pre-compensated by a control signal used in a PLL.

In conventional PLLs, there are installed external components such as a VCO or a filter outside of the PLLs, which influence on cost and yield of the product.

However, the disclosed PLL having a VCO therein can be configured into a single chip.

As a result, frequencies may be automatically pre-compensated in the disclosed PLL, thereby simplifying the embodiment of the whole PLL and enabling accurate compensation.

As discussed earlier, since frequencies may be automatically pre-compensated by control signals used in the PLL, additional frequency compensation signals are not required. Additionally, the disclosed PLL having a VCO therein can be configured into a single chip.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A PLL comprising:
   a phase detector for periodically comparing an externally inputted clock signal with a frequency of an internal clock signal, and outputting an output signal resulting from phase difference between the two signals;
   a loop filter for outputting a predetermined voltage in response to an output signal from said phase detector; and
   a VCO for outputting said internal clock signal having a frequency proportional to said predetermined voltage,
   wherein said VCO comprises a capsule for adjusting the value of capacitance by using an internal control signal, said capsule comprising:

a plurality of first capacitors connected in parallel to an output terminal of said VCC.

2. The PLL according to claim 1, wherein said capsule comprises a plurality of first switches connected, between said output terminal and the plurality of said first capacitors, respectively, and to be controlled in response to a plurality of control signals generated by using said internal control signal.

3. The PLL according to claim 1, wherein said capsule comprises a plurality of second capacitors connected in series between output terminals of said VCO.

4. The PLL according to claim 3, wherein said capsule comprises a plurality of second switches configured to be connected between an output terminal and the plurality of said second capacitors, and to be controlled in response to a plurality of control signals generated by using said internal control signal.

5. The PLL according to claim 4, wherein the plurality of said second switches is connected in parallel between an output terminal and the plurality of said second capacitors.

* * * * *